(12) United States Patent
Muramatsu

(10) Patent No.: US 7,218,182 B2
(45) Date of Patent: May 15, 2007

(54) VOLTAGE CONTROLLED OSCILLATOR

(75) Inventor: Yoshinori Muramatsu, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 474 days.

(21) Appl. No.: 10/685,030

(22) Filed: Oct. 14, 2003

(65) Prior Publication Data
US 2004/0080374 A1 Apr. 29, 2004

(30) Foreign Application Priority Data
Oct. 15, 2002 (JP) ............................. 2002-301062

(51) Int. Cl.
*H03B 1/00* (2006.01)
(52) U.S. Cl. .............. 331/177 V; 331/167; 331/117 R; 331/117 FE; 331/36 C
(58) Field of Classification Search ............ 331/177 V, 331/36 C, 117 FE, 117 R, 167
See application file for complete search history.

(56) References Cited

U.S. PATENT DOCUMENTS 7,019,598 B2 * 3/2006 Duncan et al. ............. 331/176

FOREIGN PATENT DOCUMENTS

JP 11-330852 11/1999
JP 2001-203603 7/2001

OTHER PUBLICATIONS

Sjoland, H., Improved Switched Tuning of Differential CMOS VCOs, IEEE Tranactions on Circuits and Systems II, Analog and Digital Signal Processing, U.S.A., May 2002, vol. 49, Issue 5, pp. 352-355.
A. Kral, et al., "RF-CMOS Oscillators with Switched Tuning", IEEE (1998), pp. 555-558.

* cited by examiner

*Primary Examiner*—Arnold Kinkead
(74) *Attorney, Agent, or Firm*—Scully, Scott, Murphy & Presser, P.C.

(57) ABSTRACT

An LC circuit section and a negative resistance section are provided for an LC-VCO. A pair of output terminals are provided for the LC circuit section and an inductor is connected between the output terminals, and two variable capacitors are connected in series to each other parallelly with the inductor. Further, the LC circuit section is provided with a pair of capacitors and a pair of switches that are connected between the capacitors and a ground potential and consist of NMOS transistors. Moreover, a switch that consists of the NMOS transistor is connected between a node, which is between one capacitor and one switch, and a node, which is between the other capacitor and the other switch, and the two nodes are connected to each other when the switch is closed.

6 Claims, 5 Drawing Sheets

VOLTAGE CONTROLLED OSCILLATOR

BACKGROUND OF THE INVENTION

1. Field of the Invention

The present invention relates to a voltage controlled oscillator using a resonant phenomenon of a parallel LC tank circuit. More particularly, the invention relates to a voltage controlled oscillator that is equipped with a capacitance switches and capable of changing an oscillation frequency in steps.

2. Description of the Related Art

Recently, an LC-voltage controlled oscillator (LC-VCO), which uses the resonant phenomenon of the parallel LC tank circuit, has been used as the local oscillator (LC) of a phase locked loop (PLL) circuit used for frequency multiplication and phase lock. In the LC-VCO, an inductor and a variable capacitor are mutually connected in parallel to form the parallel LC tank circuit, and the resonant phenomenon of the parallel LC tank circuit oscillates an alternating-current signal whose frequency is a resonant frequency. The resonant frequency is a frequency at which the impedance of the parallel LC tank circuit becomes infinite, and the resonant phenomenon is a phenomenon where electric current alternately flows in the inductor and the variable capacitor in the parallel LC circuit. Further, a varactor device or the like is used as the variable capacitor, whose capacitance varies according to a control voltage to be applied. Assuming the inductance of the inductor and the capacitance of the variable capacitors are L and C, respectively, the resonant frequency f is given by the following expression 1. According to the following expression 1, it is made clear that the resonant frequency f reduces when the capacitance C of the variable capacitors is increased.

$$f = \frac{1}{2\pi\sqrt{LC}} \quad \text{[Expression 1]}$$

Comparing the LC-VCO with a conventional VCO using a ring oscillator or the like, the LC-VCO has advantages shown below. Firstly, the LC-VCO has less noise than the conventional VCO using the ring oscillator or the like. This is due to the small number of transistors that cause noise because the LC-VCO uses the resonance of the parallel LC tank circuit as a basic principle. Therefore, the LC-VCO is preferable for high-speed optical communication, cell phones, wireless LAN and the like. Secondary, since the LC-VCO uses the resonance of the LC circuit as the basic principle, it is easier to obtain a high oscillation frequency than the VCO that consists of transistors and uses logic gate delay. Thirdly, the LC-VCO has the small variable width of oscillation frequency corresponding to the control voltage. For this reason, tuning sensitivity is low and oscillation frequency variation caused by the variation of the control voltage is small, which consequently leads to low noise.

On the other hand, a drawback of the LC-VCO is the above-described low tuning sensitivity. As described, although the low tuning sensitivity works advantageously to noise, the variable width of the oscillation frequency becomes small, and thus designing of the LC-VCO that achieves a desired oscillation frequency is difficult.

To overcome the drawback, an LC-VCO provided with the capacitance switches is suggested as shown in the document 'A. Kral et al., "RF-CMOS Oscillators with Switched Tuning", IEEE Custom Integrated Circuits Conf., pp. 555–558, 1998' for example. FIGS. 1A to 1C are equivalent circuit diagrams showing the LC-VCO provided with conventional capacitance switches, where FIG. 1A, FIG. 1B and FIG. 1C respectively show an equivalent circuit diagram showing the entire LC-VCO, an equivalent circuit diagram showing the capacitance switch section in an OFF state, and an equivalent circuit diagram showing the capacitance switch section in an ON state. Further, FIGS. 2A and 2B are graphs showing the variable width of the oscillation frequency taking the control voltage on the axis of abscissas and the oscillation frequency on the axis of ordinate, where FIG. 2A and FIG. 2B respectively show the variable range of the oscillation frequency when the capacitance switch section is not used, and the variable range of the oscillation frequency when the capacitance switch section is used.

As shown in FIG. 1A, the conventional LC-VCO 101 is connected to power source potential wiring VCC and ground potential wiring GND. In the LC-VCO 101, a negative resistance section 2, an LC circuit section 104 and a negative resistance section 3 are arranged in this order from the power source potential wiring VCC toward the ground potential wiring GND.

P-channel transistors 5, 6 are provided in the negative resistance section 2. One of the source/drain of the P-channel transistor 5 is connected to the power source potential wiring VCC, the other one is connected to an output terminal 7 of the LC circuit section 104, and a gate is connected to an output terminal 8. One of the source/drain of the P-channel transistor 6 is connected to the power source potential wiring VCC, the other one is connected to an output terminal 8 of the LC circuit section 104, and the gate is connected to an output terminal 7.

In the LC circuit section 104, an inductor 9 is provided between the output terminals 7, 8. Furthermore, the variable capacitors 10, 11 are provided in series between the output terminals 7, 8 parallelly with the inductor 9. The variable capacitors 10, 11 are the capacitors whose capacitance varies according to the control voltage to be input, which is the varactor device, specifically.

Moreover, a capacitance switch section 116 is provided for the LC circuit section 104, and capacitors 12, 13 and switches 14, 15 are provided for the capacitance switch section 116. The output terminal 7 is connected to one electrode of the capacitor 12, the other electrode of the capacitor 12 is connected to one terminal of the switch 14, and the other terminal of the switch 14 is connected to a ground electrode. In the same manner, the output terminal 8 is connected to the ground electrode via the capacitor 13 and the switch 15. The switches 14, 15 essentially consist of NMOS (N-type Metal Oxide Semiconductor) transistors. Although FIG. 1A shows only one capacitance switch section 116, a plurality of the capacitance switch sections 116 may be provided and connected between the output terminals 7, 8 parallelly with each other.

N-channel transistors 17, 18 are provided in the negative resistance section 3. One of the source/drain of the N-channel transistor 17 is connected to the output terminal 7 of the LC circuit section 104, the other one is connected to the ground potential wiring GND, and the gate is connected to the output terminal 8. Further, one of the source/drain of the N-channel transistor 18 is connected to the output terminal 8, the other one is connected to the ground potential wiring GND, and the gate is connected to the output terminal 7.

Next, the operation of the conventional LC-VCO 101 will be described. For example, when an electrical stimulation is applied to the LC circuit section 104 by connecting the LC-VCO 101 to the power source potential wiring VCC and ground potential wiring GND, or the like, the LC circuit section 104 oscillates a high frequency (HF) having the resonant frequency from the output terminals 7, 8. At this point, signals output form the output terminals 7, 8 are complementary signals.

However, loss by parasitic resistance is caused and oscillation stops in the end in the case of the only LC circuit section 104. Given this factor, a positive power source potential is applied to the power source potential wiring VCC and a ground potential is applied to the ground potential wiring GND to supply an electric current and provide the negative resistance sections 2, 3 to/for the LC-VCO 101, and thus it is possible to permanently oscillate resonant waves in the LC circuit section 104. Specifically, when the output terminal 7 is low and the output terminal 8 is high, for example, the P-channel transistor 5 is turned OFF and the N-channel transistor 17 is turned ON. Consequently, the ground potential is applied to the output terminal 7. Further, since the P-channel transistor 6 is turned ON and the N-channel transistor 18 is turned OFF, the power source potential is applied to the output terminal 8. In the same manner, when the output terminal 7 is high and the output terminal 8 is low, the power source potential is applied to the output terminal 7 and the ground potential is applied to the output terminal 8. Thus, the oscillation from the output terminals 7, 8 continues without attenuation.

Then, by changing the control voltage applied to the variable capacitors 10, 11, the capacitance of the variable capacitors 10, 11 linearly varies. As a result, as shown in FIG. 2A, the resonant frequency of the LC circuit section 104 varies according the control voltage so that it is possible to vary the frequency of high frequency (HF) that the LC-VCO 101 oscillates. Range A shown in FIG. 2A is the variable range of the oscillation frequency.

Furthermore, the capacitance of the entire capacitance switch section 116 varies by switching the switches 14, 15. As shown in FIG. 1B, since the switch 14 works as a capacitance and is connected to the capacitor 12 in series when the switch 14 is turned OFF, the total capacitance of the capacitor 12 and the switch 14 becomes relatively small. On the other hand, as shown in FIG. 1C, when the switch 14 is turned ON, the switch 14 works as a resistance and the total capacitance of the capacitor 12 and the switch 14 becomes relatively large. Consequently, when the switch 14 is turned OFF, the capacitance of the entire LC circuit section 104 becomes small, and thus increasing the oscillation frequency according to the above-described expression 1. Further, when the switch 14 is turned ON, the capacitance of the entire LC circuit section 104 becomes large, and thus decreasing the oscillation frequency. Accordingly, by opening/closing the switches 14, 15, it is possible to discontinuously vary the oscillation frequency. Further, it is possible to vary the oscillation frequency in steps if a plurality of the capacitance switch sections 116 are provided and individually opened/closed.

Consequently, as shown in FIG. 2B, the oscillation frequency is made to vary in steps by the capacitance switch section 116 and the control voltage of the variable capacitors 10, 11 is changed to continuously vary the oscillation frequency, so that the variable width of the oscillation frequency can be increased while the tuning sensitivity is maintained low and the oscillation frequency variation due to the variation of control voltage is inhibited, comparing to the case where the capacitance switch section 116 is not provided. Range B shown in FIG. 2B is the variable range of the oscillation frequency. Further, an oscillation frequency band can be changed by providing the capacitance switch section 116, which readily deal with a plurality of frequencies demanded in the error correction or the like in a communication system.

However, the above-described prior art show the following problems. As described, the N-channel transistor such as the NMOS transistor is used for the switches 14, 15 shown in FIG. 1A. Unlike an ideal switch, since parasitic component remains in the switches formed by such transistor in both ON state and OFF state, it is impossible to completely connect or disconnect the capacitors 12, 13 to the ground electrode. Specifically, when the switches 14, 15 are in the ON state, the switches 14, 15 work as a resistance, and they work as a capacitance in the OFF state. Therefore, when the switches 14, 15 are in the ON state, the electrode potential on the ground electrode side in the capacitors 12, 13 does not become completely the ground potential, but is affected by the potential of the output terminals 7, 8 and alternating current component remains. As a result, the effective voltage between the electrodes of the capacitors 12, 13 becomes small, and thus decreasing the effective capacitance of the capacitors 12, 13. Accordingly, an effect to reduce the oscillation frequency of the LC-VCO 101 is insufficient even if the switches 14, 15 are turned ON, and the variable width of the oscillation frequency becomes small.

Note that the resistance of the switches 14, 15 in the ON state becomes small if the channel width of the transistors that consist the switches 14, 15 is increased, and the behavior of the LC-VCO 101 becomes almost an ideal state. However, there is a problem that the size of the entire LC-VCO 101 becomes large when the transistors are larger.

SUMMARY OF THE INVENTION

An object of the present invention is to provide a voltage controlled oscillator that is small and has a large variable width of the oscillation frequency.

A voltage controlled oscillator according to the present invention has a resonant section that oscillates the alternating-current signal, and a negative resistance section that is provided between the resonant section and a power source and supplies an electric current to the resonant section synchronously with the alternating-current signal. Then, the resonant section has a pair of output terminals, an inductor connected between the pair of output terminals, a variable capacitor connected parallelly with the inductor, a pair of capacitors whose one electrodes are severally connected to the pair of output terminals, a pair of first switches severally provided between the other electrodes of the pair of capacitors and reference electrodes, and a second switch provided between the other electrodes of the pair of capacitors.

In the present invention, the resonant section essentially consists of the inductor, the variable capacitor, and the pair of the capacitors, and by supplying the resonant section with the electric current from the negative resistance section connected to the power source, the section can output the alternating-current signal whose frequency is equivalent to the resonant frequency of the resonant section. At this point, the pair of output terminals output complementary signals. Then, by changing the capacitance of the variable capacitor, it is possible to vary the resonant frequency of the resonant section and to continuously vary the frequency of the alternating-current signal to be output.

Furthermore, by opening the first switches, they are made to operate as capacitors connected to the pair of capacitors in series, and thus the entire capacitance can be reduced. Alternatively, by closing the first switches, they are made to operate as resistance connected between the pair of capacitors and the reference electrodes, and thus the entire capacitance can be increased. At this point, by closing the second switch, the electrodes of the pair of capacitors, which are not connected to the output terminals, are connected to each other. Consequently, the alternating-current component at the potential of the electrodes is offset to increase the voltage between the electrodes of the capacitors, and the effective capacitance of the capacitors can be increased. As a result, the capacitance variation of the pair of capacitors can be increased by opening/closing the first switches, and it is possible to widely vary the frequency of the alternating-current signal.

According to the present invention, the pair of output terminals are severally connected to the pair of capacitors in the resonant section of the voltage controlled oscillator, the second switch is connected between the electrodes of the pair of capacitors, which are not connected to the output terminals, the alternating-current component is removed from the potential of the electrodes of the pair of capacitors, which are not connected to the output terminals, by closing the second switch, and thus it is possible to increase the effective capacitance of the pair of capacitors. Therefore, the voltage controlled oscillator that is small and has a large variable width of oscillation frequency can be obtained.

DETAILED DESCRIPTION OF THE PREFERRED EMBODIMENT

Figure 3:
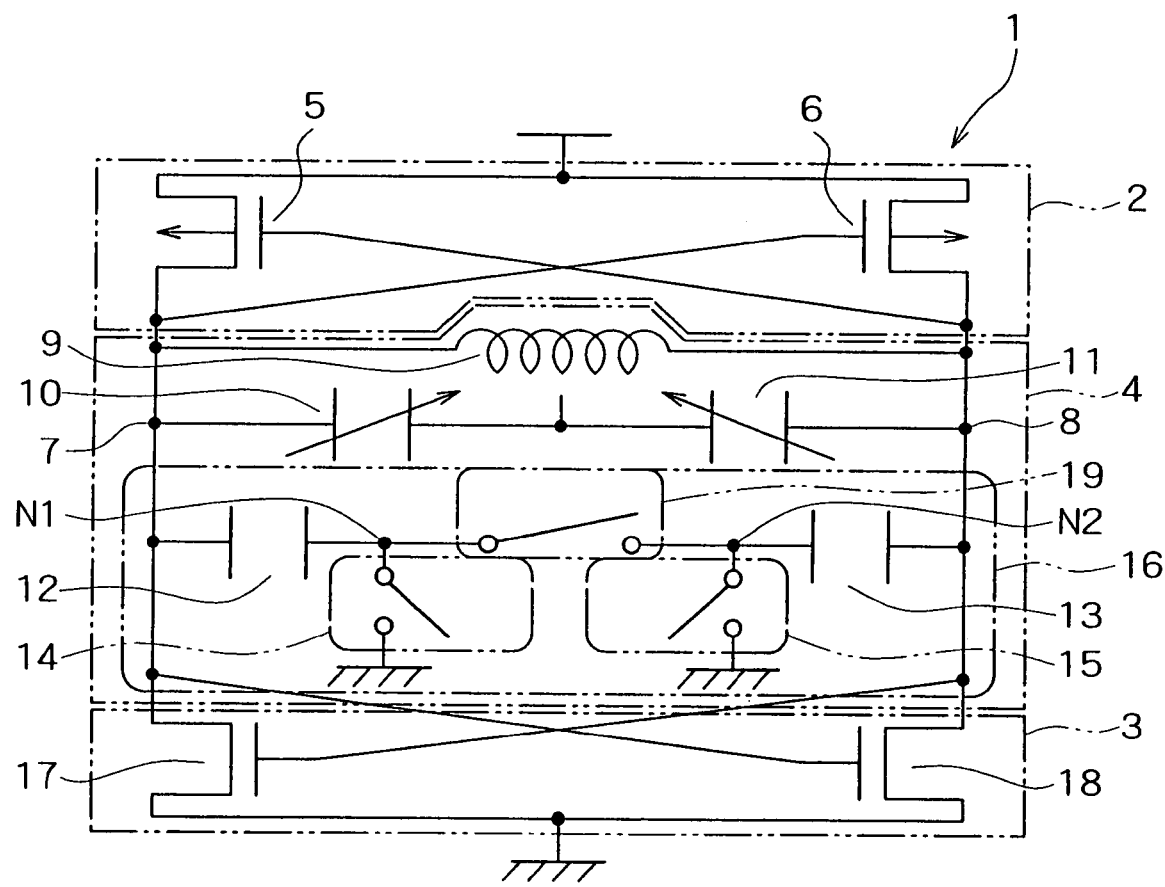
FIG. 3 is an equivalent circuit diagram showing the LC-VCO according to the embodiment of the present invention.
Figure 4A:
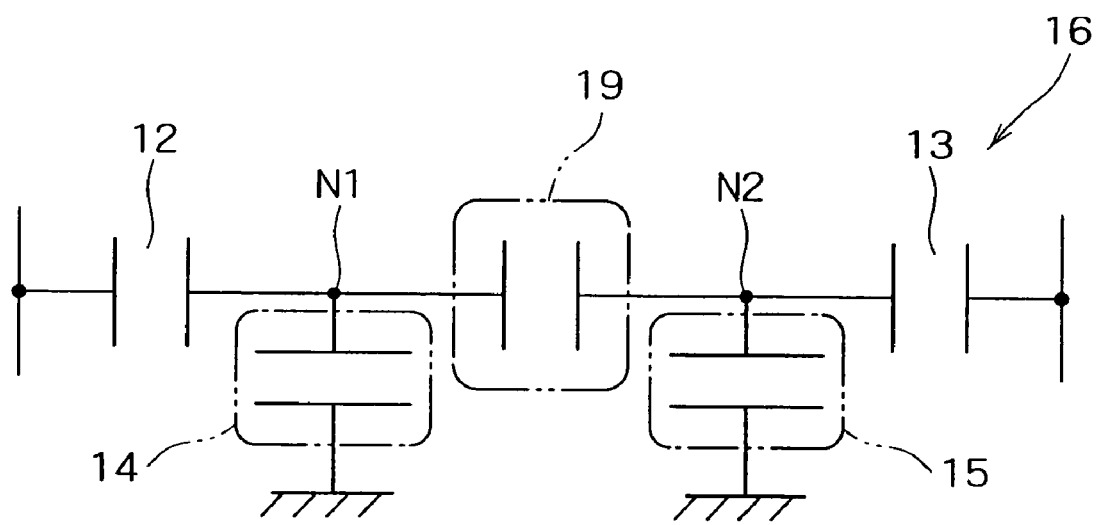
FIGS. 4A and 4B are the equivalent circuit diagram showing the capacitance switch section in the OFF state and the equivalent circuit diagram showing the capacitance switch section in the ON state.
Figure 4B:
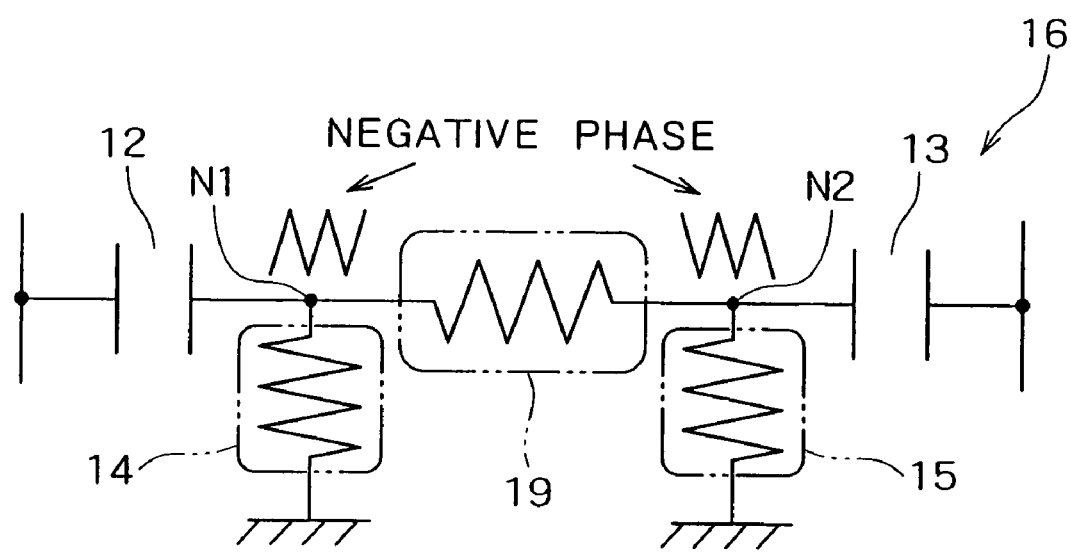

The embodiment of the present invention will be specifically described referring to the attached drawings. FIG. 3 is the equivalent circuit diagram showing an LC-VCO according to the embodiment, and FIGS. 4A and 4B are the equivalent circuit diagram showing the capacitance switch section in the OFF state and the equivalent circuit diagram showing the capacitance switch section in the ON state.

An LC-VCO, which is the voltage controlled oscillator according to the embodiment, is connected to the power source potential wiring VCC and the ground potential wiring GND. The LC-VCO is formed as an integrated circuit on a semiconductor substrate (not shown), which is used as the local oscillator (LC) of the phase locked loop circuit (PLL circuit) used for frequency multiplication and phase lock, for example.

Figure 1A:
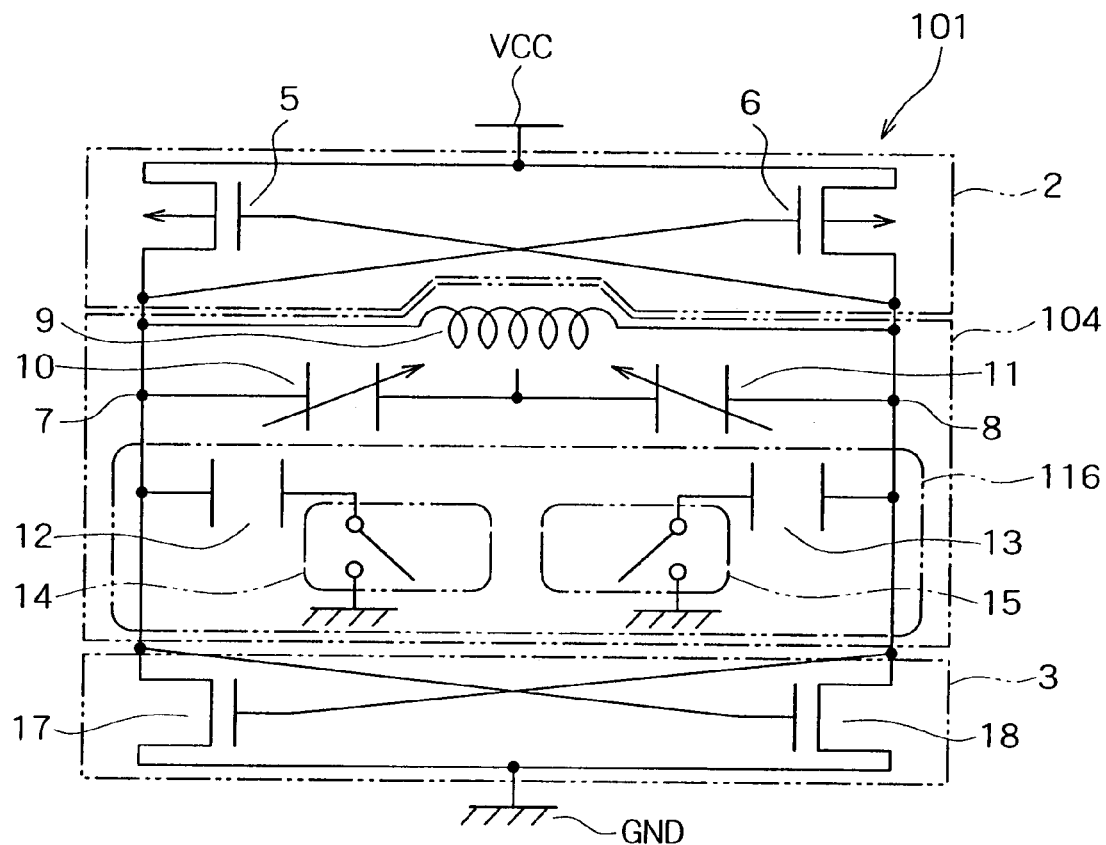
FIGS. 1A to 1C are the conventional equivalent circuit diagrams showing the LC-VCO provided with the capacitance switches, where FIG. 1A, FIG. 1B and FIG. 1C respectively show the equivalent circuit diagram showing the whole LC-VCO, the equivalent circuit diagram showing the capacitance switch section in the OFF state, and the equivalent circuit diagram showing the capacitance switch section in the ON state.
Figure 1B:
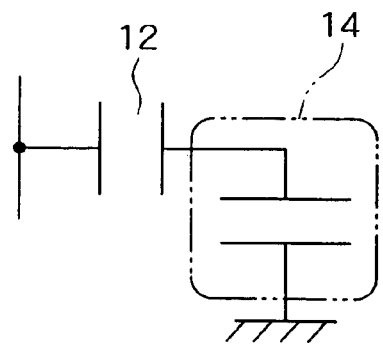
Figure 1C:
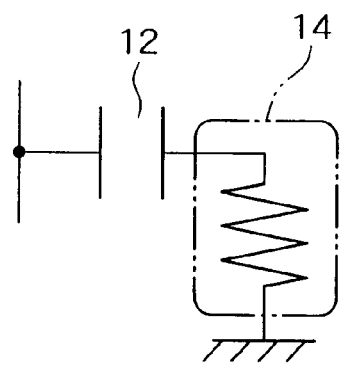
Figure 2A:
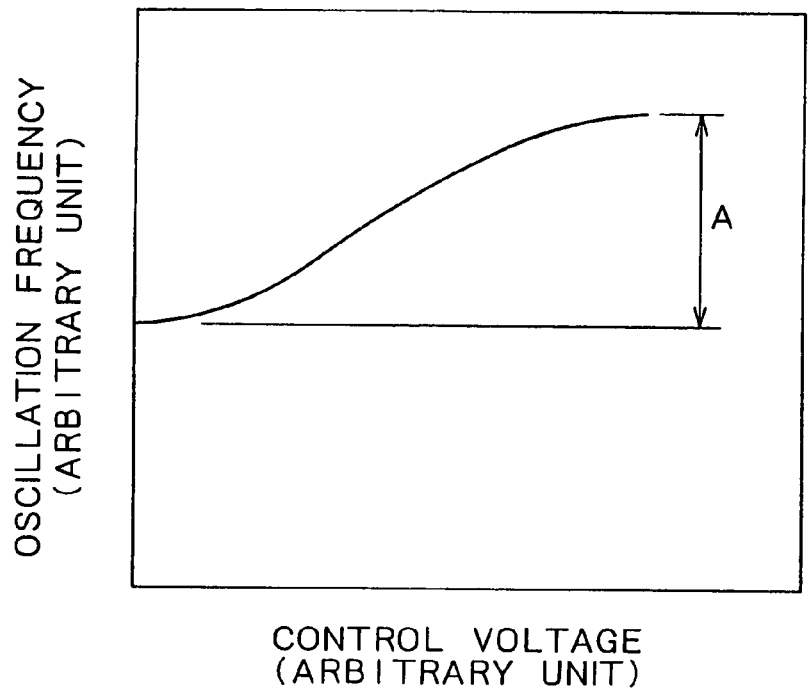
FIGS. 2A and 2B are the graphs showing the variable width of the oscillation frequency taking the control voltage on the axis of abscissas and the oscillation frequency on the axis of ordinate, where FIG. 2A and FIG. 2B respectively show the variable range of the oscillation frequency when the capacitance switch section is not used, and the variable range of the oscillation frequency when the capacitance switch section is used.
Figure 2B:
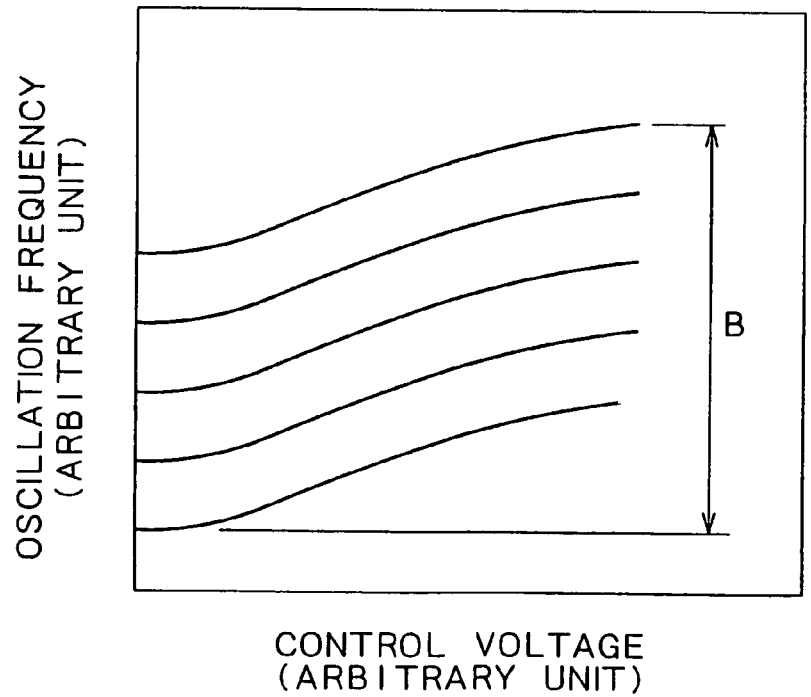

As shown in FIG. 3, in an LC-VCO 1 according to the embodiment, a negative resistance section 2 (a first section), an LC circuit section 4 and a negative resistance section 3 (a second section) are arranged in this order from the power source potential wiring VCC toward the ground potential wiring GND. The configuration of the negative resistance sections 2, 3 is the same as the negative resistance sections 2, 3 provided in the conventional LC-VCO 101 (refer to FIG. 1A).

In the LC circuit section 4, provided is an output terminal 7 that is connected to the source/drain of the P-channel transistor 5 in the negative resistance section 2, which is not connected to the power source potential wiring VCC, and to the source/drain of the N-channel transistor 17 in the negative resistance section 3, which is not connected to the ground potential wiring GND. Further, provided is an output terminal 8 that is connected to the source/drain of the P-channel transistor 6 in the negative resistance section 2, which is not connected to the power source potential wiring VCC, and to the source/drain of the N-channel transistor 18 in the negative resistance section 3, which is not connected to the ground potential wiring GND. The output terminals 7, 8 output the output signal of the LC resonant section 4 as the complementary signal.

Further, an inductor 9 is connected between the output terminals 7, 8. The inductor 9 is a spiral inductor, for example. Moreover, the variable capacitors 10, 11 are connected in series with each other between the output terminals 7, 8. In other words, the circuit that consists of the variable capacitors 10, 11 is parallelly connected to the inductor 9. The variable capacitors 10, 11 are capacitors whose capacitance varies according to the control voltage to be applied, which are the varactor devices, for example.

In addition, the LC circuit section 4 is provided with a capacitance switch section 16 connected to the output terminals 7, 8, and the capacitance switch section 16 is provided with capacitors 12, 13 and switches 14, 15, 19. One electrode of the capacitor 12 is connected to the output terminal 7, the other electrode is connected to one terminal of the switch 14, and the other terminal of the switch 14 is connected to the ground electrode. Specifically, when the switch 14 is closed, the output terminal 7 is connected to the ground electrode via the capacitor 12 and switch 14. Similarly, one electrode of the capacitor 13 is connected to the output terminal 8, the other electrode is connected to one terminal of the switch 15, and the other terminal of the switch 15 is connected to the ground electrode. Specifically, when the switch 15 is closed, the output terminal 8 is connected to the ground electrode via the capacitor 13 and switch 15.

The capacitors 12, 13 are made up of two conductor layers arranged by facing to each other and an insulating layer sandwiched between the two conductor layers, for example. The conductor layers are metal layers or polysilicon layers. The switches 14, 15, 19 essentially consist of the NMOS transistors, for example. Although FIG. 3 shows only one capacitance switch section 16, a plurality of the capacitance switch sections 16 may be provided and connected between the output terminals 7, 8 parallelly with each other.

Furthermore, one terminal of the switch 19 is connected to a node N1 between the capacitor 12 and switch 14, and the other terminal of the switch 19 is connected to a node N2 between the capacitor 13 and switch 15. Thus, the nodes N1, N2 are connected to each other when the switch 19 is closed, and the nodes N1, N2 are insulated from each other when the switch 19 is open.

Next, the operation of the LC-VCO 1 will be described. Firstly, the LC-VCO 1 is connected to the power source potential wiring VCC and ground potential wiring GND. This leads the potential in the LC circuit section 4 to nonequilibrium, and the electrical stimulation is applied to the LC circuit section 4. As a result, the LC circuit section 4 oscillates the high frequency (HF) having the resonant frequency from the output terminals 7, 8. At this point, the signals output from the output terminals 7, 8 are the complementary signal. Then, similarly to the conventional LC-VCO, the negative resistance sections 2, 3 supply the electric current to the LC circuit section 4 synchronously with the potential variation of the output terminals 7, 8, and thus the oscillation from the output terminals 7, 8 continues.

At this point, as shown in FIG. 4A, when all of the switches 14, 15, 19 are turned OFF, the switches 14, 15, 19 work as capacitors, the capacitor 12 and the switch 14 as a capacitor are connected in series, and the capacitor 13 and the switch 15 as a capacitor are connected in series. Since the capacitance of each capacitor, which consists of the switches 14, 15, 19, is smaller than the capacitance of the capacitors 12, 13, the capacitance of the capacitance switch section 16 becomes relatively small due to the above-described series connection.

On the other hand, as shown in FIG. 4B, when the switches 14, 15 are turned ON, the switches 14, 15 work as a resistance and the capacitance of the entire capacitance switch section 16 becomes relatively large. At this point, when the switch 19 is OFF, the potential of the node N1 is a potential halfway between the potential of the output terminal 7 and the ground potential, the potential of the node N2 is a potential halfway between the potential of the output terminal 8 and the ground potential, the phases of the output terminals 7, 8 are in the negative phase to each other, and therefore the phase of the potential of node N1 and the phase of the potential of node N2 are in the negative phase to each other. However, since the nodes N1, N2 are connected to each other by the switch 19 when the switch 19 is turned ON, the alternating-current components of the potentials of nodes N1, N2 offset to each other, which leads the both potentials to an equal level that is close to the ground potential. Consequently, the effective capacitance of the capacitors 12, 13 becomes large, and the capacitance of the entire capacitance switch section 16 becomes even larger.

As described, when the switches 14, 15, 19 are turned. OFF, the capacitance of the entire LC circuit section 4 becomes small and the oscillation frequency of the LC-VCO 1 becomes high according to the above-described expression 1. Further, when the switches 14, 15, 19 are turned ON, the capacitance of the entire LC circuit section 4 is increased and the oscillation frequency of the LC-VCO 1 is reduced. Therefore, by opening/closing the switches 14, 15, 19, it is possible to vary the oscillation frequency in steps. Further, it is possible to vary the oscillation frequency in steps over three levels or more if a plurality of the capacitance switch sections 16 are provided and individually opened/closed.

Furthermore, by changing the control voltage applied to the variable capacitors 10, 11, it is possible to linearly vary the capacitance of the variable capacitors 10, 11. As a result, the oscillation frequency is made to vary in steps by the capacitance switch section 16 and the oscillation frequency is made to vary continuously by the variable capacitors 10, 11, so that it is possible to increase the variable width of the oscillation frequency while the tuning sensitivity is maintained low to inhibit the variation of the oscillation frequency due to the variation of the control voltage. The operation of the LC-VCO of the embodiment other than the above-described one is the same as the operation of the above-described conventional LC-VCO.

Figure 5A:
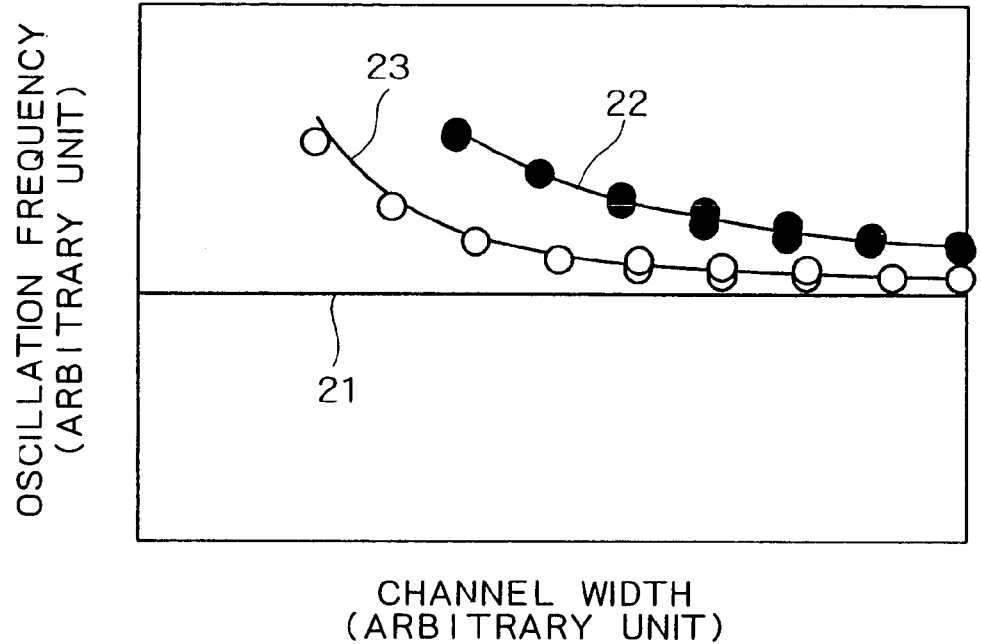
FIGS. 5A and 5B are the graphs showing the simulation results of the LC-VCO taking the channel width of the transistors that consist the switches on the axis of abscissas and the oscillation frequency of the LC-VCO on the axis of ordinate, where FIG. 5A and FIG. 5B respectively show the case where each switch is ON and the case where each switch is OFF.
Figure 5B:
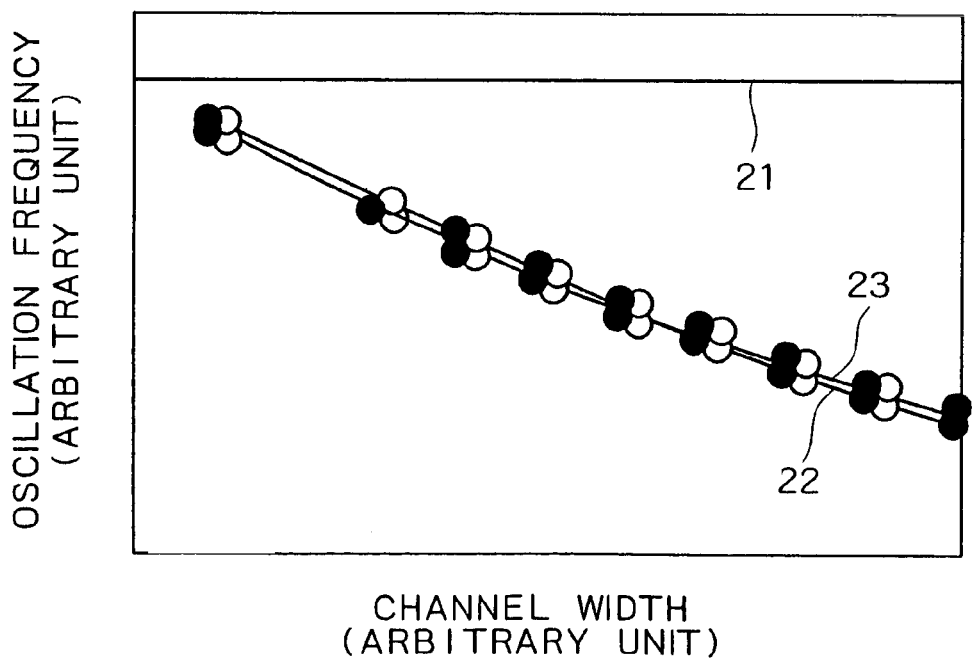

FIGS. 5A and 5B are the graphs showing the simulation results of the LC-VCO taking the channel width of the transistors that consist the switches on the axis of abscissas and the oscillation frequency of the LC-VCO on the axis of ordinate, where FIG. 5A and FIG. 5B respectively show the case where each switch is ON and the case where each switch is OFF.

In FIGS. 5A and 5B, a line 21 shows a simulation result in the case where the switches 14, 15, 19 are assumed to be ideal switches having no parasitic component. Further, black circles (●) and a line 22 represent the simulation result of the conventional LC-VCO 101 (refer to FIG. 1A) in which the switch 19 is not provided, and white circles (○) and a line 23 represent the simulation result of the LC-VCO 1 (refer to FIG. 3) of the embodiment provided with the switch 19.

As shown in FIG. 5A, when the switches 14, 15, 19 are ON, the characteristics of the LC-VCO of the embodiment shown by the line 23 are closer to the ideal state shown by a line 21 than to the characteristics of the conventional LC-VCO shown by the line 22 if the channel widths of the transistors are the same. Therefore, the performance of the LC-VCO of the embodiment can be improved comparing to the conventional LC-VCO when the sizes are the same, and the size can be made smaller when the performance is the same. On the other hand, as shown in FIG. 5B, when the switches 14, 15, 19 are OFF, the characteristics of the LC-VCO of the embodiment is substantially equivalent to those of the conventional LC-VCO.

As described above, by providing the capacitance switch section 16 and opening/closing the switches 14, 15, it is possible to discontinuously vary the oscillation frequency, in the embodiment. Then, by turning the switches 14, 15 ON and turning the switch 19 ON, the potentials of the nodes N1, N2 are made equal to each other and the effective capacitance of the capacitors 12, 13 can be increased, so that it is possible to increase the capacitance of the entire capacitance switch section 16 and the oscillation frequency of the LC-VCO 1 can be widely reduced. As a result, it is possible to widely vary the oscillation frequency of the LC-VCO 1 by opening/closing the switches 14, 15, 19.

Furthermore, the oscillation frequency band can be changed by providing the capacitance switch section 16, which readily deal with a plurality of frequencies demanded in the error correction or the like in the communication system. Additionally, by changing the control voltage of the variable capacitors 10, 11 to continuously vary the oscillation frequency, the oscillation frequency can be accurately controlled. Accordingly, the variable width of the oscillation frequency can be increased while the tuning sensitivity is maintained low and the oscillation frequency variation due to the variation of control voltage is inhibited. Consequently, it is possible to obtain the LC-VCO that is small and has a large variable width of oscillation frequency.

Note that the example where the switches 14, 15, 19 consist of the NMOS transistors has been shown in the embodiment, but the switches 14, 15, 19 may consist of PMOS transistors or CMOS transistors. When the switches consist of the CMOS transistors, the area of the switches becomes large comparing to the case where the switches consist of the NMOS transistors, but the parasitic resistance becomes smaller to reduce electric current loss by a threshold value.

What is claimed is:

1. A voltage controlled oscillator, comprising:
   a resonant section that oscillates an alternating-current signal, said resonant section comprising:
   a pair of output terminals;
   an inductor connected between said pair of output terminals;
   a variable capacitor parallelly connected to said inductor;
   a pair of capacitors, where one electrode of each capacitor is serially connected to said pair of output terminals;
   a pair of first switches, where each switch is serially provided between the other electrode of the pair of capacitors and a reference electrode; and
   a second switch provided between the other electrodes of said pair of capacitors; and
   a negative resistance section that is provided between said resonant section and a power source and supplies an electric current to said resonant section synchronously with said alternating-current signal.

2. The voltage controlled oscillator according to claim 1, wherein said first and second switches are a type of transistor selected from a group that consists of NMOS transistors, PMOS transistors and CMOS transistors.

3. The voltage controlled oscillator according to claim 1, wherein said variable capacitor is a varactor device to which a control voltage is input and whose capacitance varies according to the control voltage.

4. The voltage controlled oscillator according to claim 1, wherein said inductor is a spiral inductor formed on a substrate.

5. The voltage controlled oscillator according to claim 1, wherein
   said power source has high potential wiring and low potential wiring,
   said pair of output terminals essentially having a first output terminal and a second output terminal, and
   said negative resistance section further comprising:
   a first section, said first section having a first P-channel transistor, in which one of source/drain is connected to said high potential wiring, the other one of source/drain is connected to said first output terminal, and a gate connected to said second output terminal; and a second P-channel transistor, in which one of source/drain is connected to said high potential wiring, the other one connected to said second output terminal, and a gate is connected to said first output terminal; and
   a second section, said second section having a first N-channel transistor, in which one of source/drain is connected to said low potential wiring, the other one is connected to said first output terminal, and a gate connected to said second output terminal; and a second N-channel transistor, in which one of source/drain is connected to said low potential wiring, the other one is connected to said second output terminal, and a gate connected to said first output terminal.

6. The voltage controlled oscillator according to claim 1, wherein said oscillator is the local oscillator of a phase locked loop circuit.

* * * * *